(12) United States Patent
Cevrero et al.

(10) Patent No.: US 10,142,090 B1
(45) Date of Patent: Nov. 27, 2018

(54) OCTAGONAL PHASE ROTATORS

(71) Applicant: INTERNATIONAL BUSINESS MACHINES CORPORATION, Armonk, NY (US)

(72) Inventors: Alessandro Cevrero, Oberrieden (CH); Pier Andrea Francese, Adliswil (CH); Ilter Özkaya, Adliswil (CH); Thomas H. Toifl, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/702,811

(22) Filed: Sep. 13, 2017

(51) Int. Cl.
    *H04L 7/00* (2006.01)
    *H04B 1/40* (2015.01)
    *H03D 7/12* (2006.01)
    *H03M 1/66* (2006.01)

(52) U.S. Cl.
    CPC ........... *H04L 7/0029* (2013.01); *H03D 7/125* (2013.01); *H04B 1/40* (2013.01); *H03M 1/66* (2013.01)

(58) Field of Classification Search
    CPC ........ H03H 11/20; H03H 11/16; H03L 7/0807
    See application file for complete search history.

(56) References Cited

U.S. PATENT DOCUMENTS

2010/0109734 A1* 5/2010 Rylov .................... H03H 11/20 327/256
2016/0182216 A1 6/2016 Bonaccio et al.

OTHER PUBLICATIONS

Francese et al., "A 16 Gb/s 3.7 mW/Gb/s 8-Tap DFE Receiver and Baud-Rate CDR With 31 kppm Tracking Bandwidth," IEEE Journal of Solid-State Circuits, vol. 49, No. 11, Nov. 2014, pp. 2490-2502.
Gangasani et al., A 16-Gb/s Backplane Transceiver With 12-Tap Current Integrating DFE and Dynamic Adaptation of Voltage Offset and Timing Drifts in 45-nm SOI CMOS Technology, IEEE Journal of Solid-State Circuits, vol. 47, No. 8, Aug. 2012, pp. 1828-1841.
Hanumolu et al., "A Wide-Tracking Range Clock and Data Recovery Circuit," IEEE Journal of Solid-State Circuits, vol. 43, No. 2, Feb. 2008, pp. 425-439.
Cevrero et al., "A 60 Gb/s 1.9 pJ/bit NRZ Optical-Receiver with Low Latency Digital CDR in 14nm CMOS FinFET," 2017 Symposium on VLSI Circuits Digest of Technical Papers, Jun. 8, 2017, Copyright 2017 JSAP, Grace Period Disclosure, pp. 1-2.
Cevrero et al., "A 60 Gb/s 1.9 pJ/bit NRZ Optical Receiver with Low Latency Digital CDR in 14nm CMOS FinFET," Presention to the Symposia on VLSI Technology and Circuits, Presented on Jun. 8, 2017, Grace Period Disclosure, pp. 1-33.

* cited by examiner

*Primary Examiner* — Ross Varndell
(74) *Attorney, Agent, or Firm* — Jordan T. Schiller

(57) ABSTRACT

Octagonal phase rotator apparatus is provided for producing an output signal that is phase dependent on a digital control code. The apparatus includes an I-mixer, a Q-mixer, and first and second IQ-mixers. The I-mixer is responsive to I-control bits of the digital control code. The Q-mixer is responsive to Q-control bits of the digital control code. The first and second IQ-mixers are respectively responsive to one or more IQ1-control bits and one or more IQ2-control bits of the digital control code. The I-mixer comprises an I-DAC for steering current between a positive phase IP and a negative phase IN of an in-phase (I) signal wherein the one or more I-control bits control switching of a first current unit between IP and IN, and a set of amplifiers for weighting the phases IP and IN, in dependence on current steered to each phase by the I-DAC, to produce a weighted I-signal.

17 Claims, 5 Drawing Sheets

OCTAGONAL PHASE ROTATORS

STATEMENT REGARDING PRIOR DISCLOSURES BY THE INVENTOR OR A JOINT INVENTOR

Aspects of the present invention have been publicly disclosed by the Applicant at 2017 Symposium on VLSI Circuits Digest of Technical Papers on Jun. 8, 2017, titled "A 60 Gb/s 1.9 pJ/bit NRZ Optical-Receiver with Low Latency Digital CDR in 14 nm CMOS FinFET". The following disclosure is submitted under 35 U.S.C. § 102(b)(1)(A).

BACKGROUND

The present invention relates generally to octagonal phase rotators.

A phase rotator is a device which produces an output signal, wherein the phase is dependent on a digital control code supplied to the device. Phase rotators are used, for example, in I/O (Input/Output) link transceiver circuits of data processors and communications systems to rotate the phase of an input reference clock signal to obtain an output clock signal with a desired phase for data transmission/recovery. The phase rotator apparatus typically comprises a set of DACs (digital-to-analog converters) which steer current between different phases of an I/Q (in-phase and quadrature) reference signal in dependence on particular bits of the digital control code, and a set of amplifiers which receive and weight the phases of the I/Q reference signal, based on current steered to each phase by the DACs. An output circuit sums the weighted output signals from the amplifiers to produce the phase-adjusted output signal. In effect, the phase rotator operates as a current-steered mixer which generates the output signal by interpolating between the different phases of the reference signal in dependence on the input control code.

Octagonal phase rotators typically comprise three DACs which may be referred to as an I-DAC, a Q-DAC and an IQ-DAC. The I-DAC steers current between opposite polarities (positive and negative phases, "IP" and "IN" respectively) of the in-phase (I) signal. The Q-DAC steers current between positive and negative phases ("QP" and "QN" respectively) of the quadrature (Q) signal. The IQ-DAC steers current between all phases IP, IN, QP, QN. In particular, the IQ-DAC steers current between the I and Q signals, and also switches the current between the positive and negative phases of each signal. This switching is effected by I and Q polarity switches in the IQ-DAC. The rotator thus interpolates between the four phases IP, IN, QP, QN. The digital control code controls operation of the DACs such that a 360-degree phase rotation in the output signal, produced by successive incremental changes in the code, produces an octagonal phase envelope on an I/Q phase diagram representing how current is steered between the four phases. The polarity switches in the IQ-DAC are activated at quadrant crossings of the I/Q phase envelope, i.e. when the phase changes between IP and IN, or between QP and QN. An example of such an octagonal phase rotator is described in "A 16 Gb/s 3.7 mW/Gb/s 8-Tap DFE Receiver and Baud-Rate CDR With 31 kppm Tracking Bandwidth", P. A. Francese et al., IEEE Journal of Solid-State Circuits, Vol. 49, No. 11, 2014, pp. 2490-2502.

SUMMARY

According to at least one embodiment of the present invention there is provided octagonal phase rotator apparatus for producing an output signal of phase dependent on a digital control code. The apparatus includes an I-mixer, a Q-mixer, and first and second IQ-mixers. The I-mixer is responsive to k I-control bits of the code. The Q-mixer is responsive to k Q-control bits of the code. The first and second IQ-mixers are respectively responsive to n IQ1-control bits and n IQ2-control bits of the code. The I-mixer comprises an I-DAC for steering current between a positive phase IP and a negative phase IN of an in-phase signal wherein each I-control bit controls switching of a first current unit between IP and IN, and a set of amplifiers for weighting the phases IP and IN, in dependence on current steered to each phase by the I-DAC, to produce a weighted I-signal. The Q-mixer comprises a Q-DAC for steering current between a positive phase QP and a negative phase QN of a quadrature signal wherein each Q-control bit controls switching of a said first current unit between QP and QN, and a set of amplifiers for weighting the phases QP and QN, in dependence on current steered to each phase by the Q-DAC, to produce a weighted Q-signal. Each IQ-mixer comprises an I-DAC for steering current between IP and IN, a Q-DAC for steering current between QP and QN, and a set of amplifiers for weighting the phases IP, IN, QP and QN, in dependence on current steered to each phase by the I- and Q-DACs, to produce a weighted IQ-signal. Each of the n control bits of each IQ-mixer controls switching of a second current unit in each of the I- and Q-DACS of that mixer such that current units are switched between IP,QN and IN,QP by the I- and Q-DACs of the first IQ-mixer and between IP,QP and IN,QN by the I- and Q-DACs of the second IQ-mixer. The apparatus further comprises a summation circuit arranged to sum the weighted I-, Q- and IQ-signals to produce the output signal.

At least one further embodiment of the invention provides link transceiver apparatus comprising a transmitter circuit for transmitting data over a link and a receiver circuit for receiving data from the link, wherein each of the transmitter and receiver circuits comprise octagonal phase rotator apparatus as described above.

Embodiments of the invention will be described in more detail below, by way of illustrative and non-limiting examples, with reference to the accompanying drawings.

DETAILED DESCRIPTION

Figure 1:
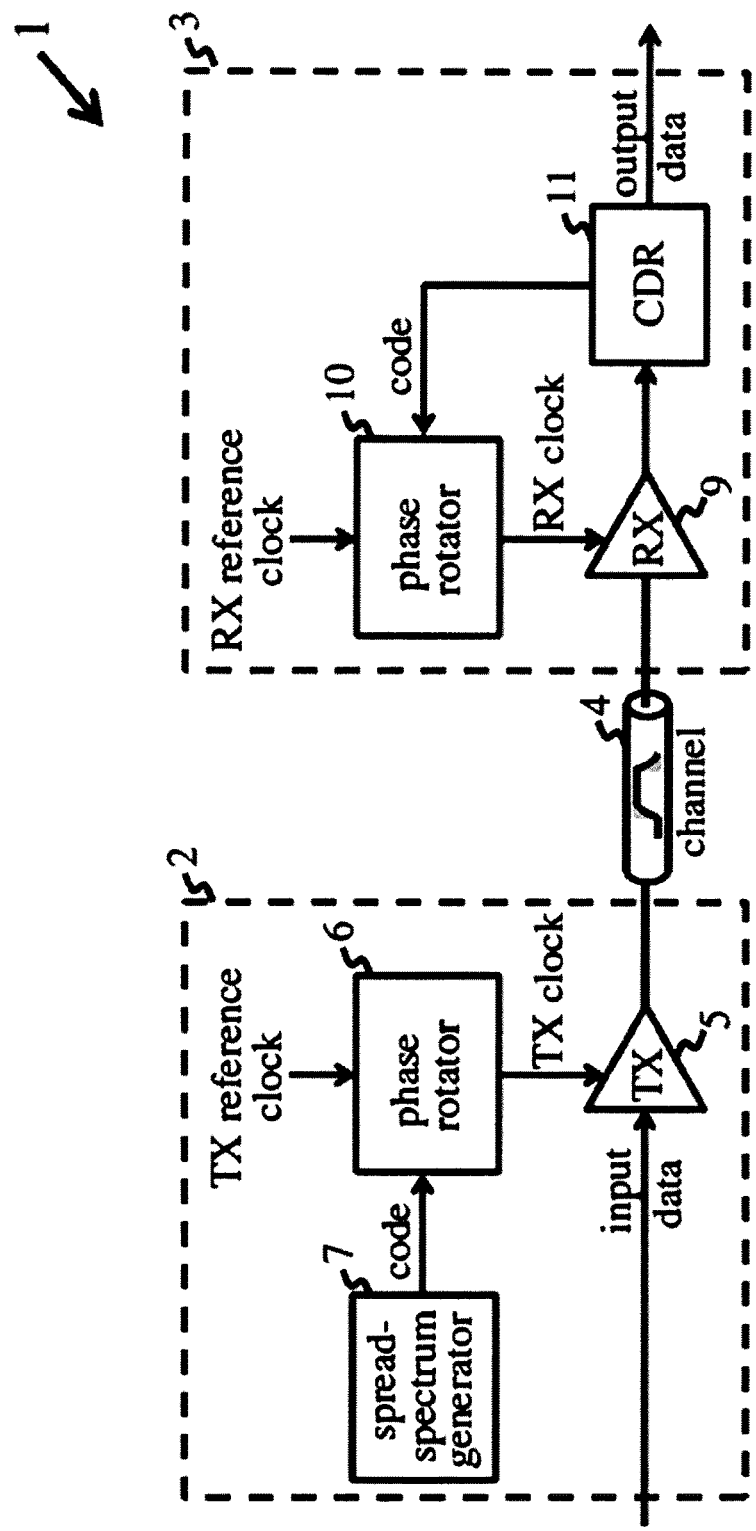
FIG. 1 is a schematic representation of an I/O link transceiver apparatus, in accordance with an embodiment of the present invention.

FIG. 1 illustrates the basic structure of an I/O link transceiver apparatus in which phase rotators, embodying the invention, may be employed. The transceiver apparatus may be used, for example, in microprocessors for communications between one or more constituent processors and other components, such as external memory, graphical processing units (GPUs), field programmable gate arrays (FPGAs), application specific integrated circuits (ASICs), e.g. graphic accelerators, hard discs, adapters, etc., which are interconnected via one or more buses. The transceiver apparatus 1 includes a transmitter circuit, indicated generally at 2, and a receiver circuit, indicated generally at 3, for transmitting/receiving data via a link established over physical channel 4, e.g. an I/O bus.

With continued reference to FIG. 1, transceivers in components at each end of channel 4 typically include both transmitter circuit 2 and receiver circuit 3. The transmitter side of transceiver 1 includes transmission (TX) circuitry 5, of generally known form, for converting input data into analog signals transmitted over channel 4. Operation of TX circuitry 5 is controlled by a TX clock signal output by a phase rotator 6. Phase rotator 6 receives a TX reference clock signal and produces a TX clock signal with a phase dependent on a digital control code supplied by a control code generator. In this example, the control code generator is implemented by a spread-spectrum generator 7, which outputs a control code that modulates the TX clock phase to distribute signal power across a sufficiently wide frequency band to mitigate electromagnetic interference and cross-talk across channels and I/O links.

On the receiver side, circuit 3 includes receiver (RX) circuitry 9, of generally known form, for receiving and sampling signals from channel 4 at timings controlled by an RX clock signal from a phase rotator 10. Phase rotator 10 receives a RX reference clock signal and generates the RX clock with a phase dependent on a digital control code supplied by a control code generator implemented here by a CDR (clock-and-data recovery) circuit 11. CDR circuit 11 operates to generate the control code so that the RX clock phase is maintained aligned to that of the TX clock at the transmitter, and may also compensate for frequency offsets between the two reference clocks by continuously shifting the phase position. Implementations of CDR circuit 11 and spread-spectrum generator 7 are well known in the art and the detailed operation is orthogonal to the phase rotators described below. By way of example, transceivers with phase rotators 6, 10 described below may be used in I/O links conforming to proprietary protocols such as the NVIDIA NVLINK2 protocol or the IBM EDI (Elastic Data Interface) plus protocol, or to open communications standards such as PCIe-4 (Peripheral Component Interconnect Express 4.0). NVIDIA NVLINK2 protocol and the IBM EDI may be registered trademarks of their respective owners. Multiple phase rotators in the receiving units may be implemented to generate clocks aligned to different phases with respect to the incoming data (e.g. one aligned to the zero-crossings and one aligned in the optimal phase to minimize the bit error rate of the received signal), and it is also common to provide a third phase rotator used in a test mode to monitor/characterize the received data at various phase positions. In a power optimized receiving unit architecture, use of a single phase rotator is preferred as discussed in the Francese et al. reference above.

Figure 2:
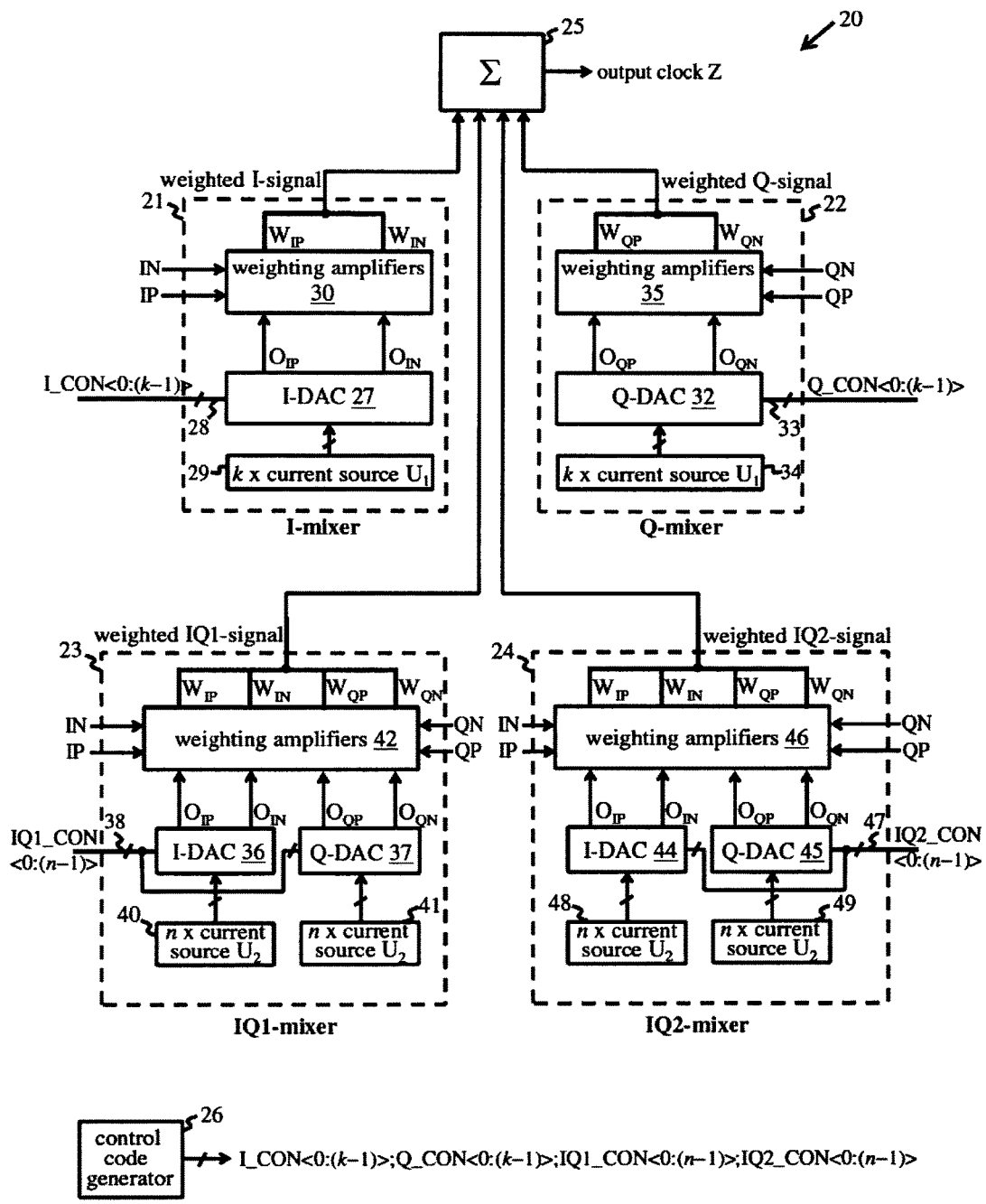
FIG. 2 is a schematic block diagram of an octagonal phase rotator apparatus, in accordance with an embodiment of the invention.

FIG. 2 illustrates the basic structure of an octagonal phase rotator (OPR) 20 embodying the invention. OPR 20 may be used as a phase rotator 6, 10 in the transceiver of FIG. 1. OPR 20 comprises four mixer sections 21, 22, 23 and 24, referred to herein as an I-mixer, a Q-mixer, and first and second IQ-mixers (labelled IQ1-mixer and IQ2-mixer respectively). The mixers 21 through 24 provide output signals to a summation circuit 25. Each mixer operates as a current-steered mixer for interpolating between different phases of an I/Q reference clock signal (e.g. the TX reference clock or RX reference clock in FIG. 1) supplied to OPR 20 in operation. The I-mixer 21 interpolates between positive and negative phases IP and IN of the in-phase (I) clock signal. The Q-mixer 22 interpolates between positive and negative phases QP and QN of the quadrature (Q) clock signal. The IQ1-mixer 23 and IQ2-mixer 24 each interpolate between phases of both of the I and Q signals. The interpolation in each mixer is controlled by different bits of a digital control code supplied by control code generator 26 (e.g. spread-spectrum generator 7 or CDR 11 of FIG. 1) connected to the mixers 21 through 24. In particular, I-mixer 21 is responsive to a plurality (k) of I-control bits, denoted here by I_CON<0:(k−1)>, of the control code. Q-mixer 22 is responsive to k Q-control bits, denoted by Q_CON<0:(k−1)>, of the code. IQ1-mixer 23 is responsive to a plurality (n) of IQ1-control bits, denoted by IQ1_CON<0:(n−1)>, of the code. IQ2-mixer 24 is responsive to n IQ2-control bits, denoted by IQ2_CON<0:(n−1)>, of the code.

I-mixer 21 includes a DAC (I-DAC 27) for steering current between the positive phase IP and negative phase IN of the I clock signal in dependence on the k I-control bits I_CON<0:(k−1)>. Each I-control bit <0:(k−1)> controls switching of a first unit of current $U_1$ between the phases IP and IN. The I-control bits I_CON<0:(k−1)> are supplied by code generator 26 on k bit lines forming I-DAC control input 28 in FIG. 2. I-DAC 27 comprises k switches (not shown in FIG. 2) each connected to a respective one of k current sources 29 supplying a first current unit $U_1$. The output of each switch in I-DAC 27 is supplied to one of two I-DAC outputs, a positive output $O_{IP}$ or a negative output $O_{IN}$, in dependence on the state (1 or 0) of the corresponding control bit I_CON<0:(k−1)>. I-mixer 21 further comprises a set of amplifiers, indicated generally at 30, for receiving the input clock phases IP and IN and weighting the phases, in dependence on current steered to each phase by I-DAC 27, to produce a weighted I-signal. In particular, positive clock phase IP is weighted based on current on positive output $O_{IP}$ of the I-DAC, and the resulting weighted IP signal is supplied output $W_{IP}$. The negative clock phase IN is weighted based on current on negative output $O_{IN}$ of I-DAC 27, and the resulting weighted IN signal is supplied to output $W_{IN}$. The weighted signals on outputs $W_{IP}$ and $W_{IN}$ collectively provide the weighted I-signal produced by I-mixer 21. In this example, the weighted IN and IP signals are combined in I-mixer 21 to produce the output weighted I-signal.

The structure of Q-mixer 22 corresponds generally to that of I-mixer 21, including a DAC (Q-DAC 32) for steering current between the positive phase QP and negative phase QN of the Q clock signal in dependence on the k Q-control bits Q_CON<0:(k−1)>. Each Q-control bit <0:(k−1)> controls switching of a first current unit $U_1$ between the phases QP and QN. The control bits Q_CON<0:(k−1)> are supplied by code generator 26 on k bit lines forming Q-DAC control input 33. Q-DAC 32 also comprises k switches (not shown) each connected to a respective one of k current sources 34 supplying a first current unit $U_1$. The output of each switch is supplied to either a positive Q-DAC output $O_{QP}$ or a negative Q-DAC output $O_{QN}$ in dependence on the state of the corresponding control bit Q_CON<0:(k−1)>. Q-mixer 22 also includes a set of amplifiers 35 for receiving the input clock phases QP and QN and weighting the phases, in dependence on current steered to each phase by Q-DAC 32, to produce a weighted Q-signal. The positive clock phase QP is weighted based on current on positive output $O_{QP}$ of the Q-DAC, and the resulting weighted QP signal is supplied to output $W_{QP}$. The negative clock phase QN is weighted based on current on negative output $O_{QN}$ of the Q-DAC, and the resulting weighted QN signal is supplied to output $W_{QN}$. The weighted signals on outputs $W_{IP}$ and $W_{IN}$ collectively provide the weighted Q-signal and are combined here to produce the weighted Q-signal output by Q-mixer 22.

The IQ1-mixer 23 includes an I-DAC 36 for steering current between the phases IP and IN of the I clock signal, and a Q-DAC 37 for steering current between the phases QP and QN of the Q clock signal. The steering of current by both I-DAC 36 and Q-DAC 37 is controlled by the IQ1-control bits IQ1_CON<0:(n−1)>. The control bits IQ1_CON<0:(n−1)> are supplied to both I-DAC 36 and Q-DAC 37 on n bit lines forming control input 38. I-DAC 36 comprises n switches each connected to a respective one of n current sources 40 supplying a second unit of current $U_2$. The output of each switch is supplied to either a positive I-DAC output $O_{IP}$ or a negative I-DAC output $O_{IN}$ in dependence on the state of the corresponding control bit IQ1_CON<0:(n−1)>. Q-DAC 37 similarly comprises n switches connected to respective current sources 41, each supplying a second current unit $U_2$. The output of each switch is supplied to either a positive Q-DAC output $O_{QP}$ or a negative Q-DAC output $O_{QN}$ in dependence on the state of the corresponding control bit IQ1_CON<0:(n−1)>. Each of the n control bits IQ1_CON<0:(n−1)> of IQ1-mixer 23 thus controls switching of a second current unit $U_2$ in each of the I-DAC 36 and Q-DAC 37. The switching is effected such that, when I-DAC 36 switches a current unit from IP to IN in response to a given IQ1-control bit, Q-DAC 37 switches a current unit from QN to QP in response to that bit. Conversely, when I-DAC 36 switches a current unit from IN to IP, Q-DAC 37 switches a current unit from QP to QN. The current units are thus switched between IP,QN and IN,QP by I-DAC 36 and Q-DAC 37 of IQ1-mixer 23.

IQ1-mixer 23 also includes a set of amplifiers 42 for receiving and weighting all input clock phases IP, IN, QP, and QN in dependence on current steered to each phase by the I- and Q-DACs 36 and 37, to produce a weighted IQ-signal. The phases IP, IN, QP, and QN are weighted based on current on DAC outputs $O_{IP}$, $O_{IN}$, $O_{QP}$ and $O_{QN}$ respectively, and the corresponding weighted signals are supplied to respective outputs $W_{IP}$, $W_{IN}$, $W_{QP}$ and $W_{QN}$. The weighted signals collectively provide the weighted IQ-signal (in this case "IQ1-signal") produced by IQ1-mixer 23. The weighted signals are combined in this example to produce the output weighted IQ1-signal.

The structure of IQ2-mixer 24 corresponds generally to that of IQ1-mixer 23. IQ2-mixer 24 thus comprises an I-DAC 44 for steering current between IP and IN, a Q-DAC 45 for steering current between QP and QN, and a set of amplifiers 46 for weighting all phases IP, IN, QP and QN in dependence on current steered to each phase by the I- and Q-DACs 44 and 45, to produce a weighted IQ-signal (in this case "IQ2-signal"). The steering of current by both I-DAC 44 and Q-DAC 45 is controlled by the IQ2-control bits IQ2_CON<0:(n−1)> which are supplied to both DACs on n bit lines forming control input 47. I-DAC 44 and Q-DAC 45 each comprise n switches connected to respective current sources 48, 49, each supplying a second current unit $U_2$. The output of each I-DAC switch is supplied to either a positive I-DAC output $O_{IP}$ or a negative I-DAC output $O_{IN}$ in dependence on the state of the corresponding control bit IQ2_CON<0:(n−1)>. The output of each Q-DAC switch is supplied to either a positive Q-DAC output $O_{QP}$ or a negative Q-DAC output $O_{QN}$ in dependence on the state of the corresponding control bit. Each of the n control bits IQ2_CON<0:(n−1)> of the IQ2-mixer thus controls switching of a second current unit $U_2$ in each of the I- and Q-DACS 44 and 45. Here, the switching is effected such that when I-DAC 44 switches a current unit from IP to IN, in response to a given IQ2-control bit, Q-DAC 45 switches a current unit from QP to QN in response to that bit. Conversely, when I-DAC 44 switches a current unit from IN to IP, Q-DAC 45 switches a current unit from QN to QP. The current units are thus switched between IP,QP and IN,QN by the I- and Q-DACs 44 and 45 of IQ2-mixer 24. Amplifiers 46 weighting phases IP, IN, QP, and QN based on current on DAC outputs $O_{IP}$, $O_{IN}$, $O_{QP}$ and $O_{QN}$ respectively, and the corresponding weighted signals are supplied to respective outputs $W_{IP}$, $W_{IN}$, $W_{QP}$ and $W_{QN}$. The weighted signals collectively provide the weighted IQ-signal and are combined here to produce the weighted IQ2-signal output by IQ2-mixer 24.

The outputs of all mixers 21 through 24 are connected to summation circuit 25. The summation circuit 25 sums the weighted I-, Q- and IQ-signals from the mixers to produce an output clock signal Z. The phase of the output signal Z is dependent on the digital control code supplied by control code generator 26. OPR 20 thus operates as a four-quadrant current-steered mixer which interpolates between the clock phases IP, IN, QP, QN of the I/Q reference clock to produce the output clock signal Z with a required phase determined by the control code. Successive phase states of OPR 20 are obtained by changing one bit at a time of the control code. A 360-degree phase rotation through all possible rotator states produces an octagonal phase envelope on an I/Q phase diagram representing how current is steered between the four clock phases.

Operation of the IQ1- and IQ2-mixers described above enables the octagonal phase envelope to be achieved without using polarity switches as in prior octagonal rotators. These polarity switches are activated every time the output clock phase switches between quadrants of the I/Q phase envelope, and cause glitching transients during phase updates. This causes systematic jitter in rotator operation and is detrimental to dynamic performance (e.g. clock systematic jitter when the phase rotator rotates because of a frequency offset). Polarity switches also introduce parasitic effects in the rotator circuitry. The parasitic capacitance on the common source is high, resulting in slower switching behavior and compromising performance. The parasitic resistance on the tail reduces the available headroom due to the resulting voltage drop. In contrast, the above embodiment provides an OPR implementation without polarity switches, eliminating glitches at quadrant transitions and offering significantly enhanced performance.

Figure 3:
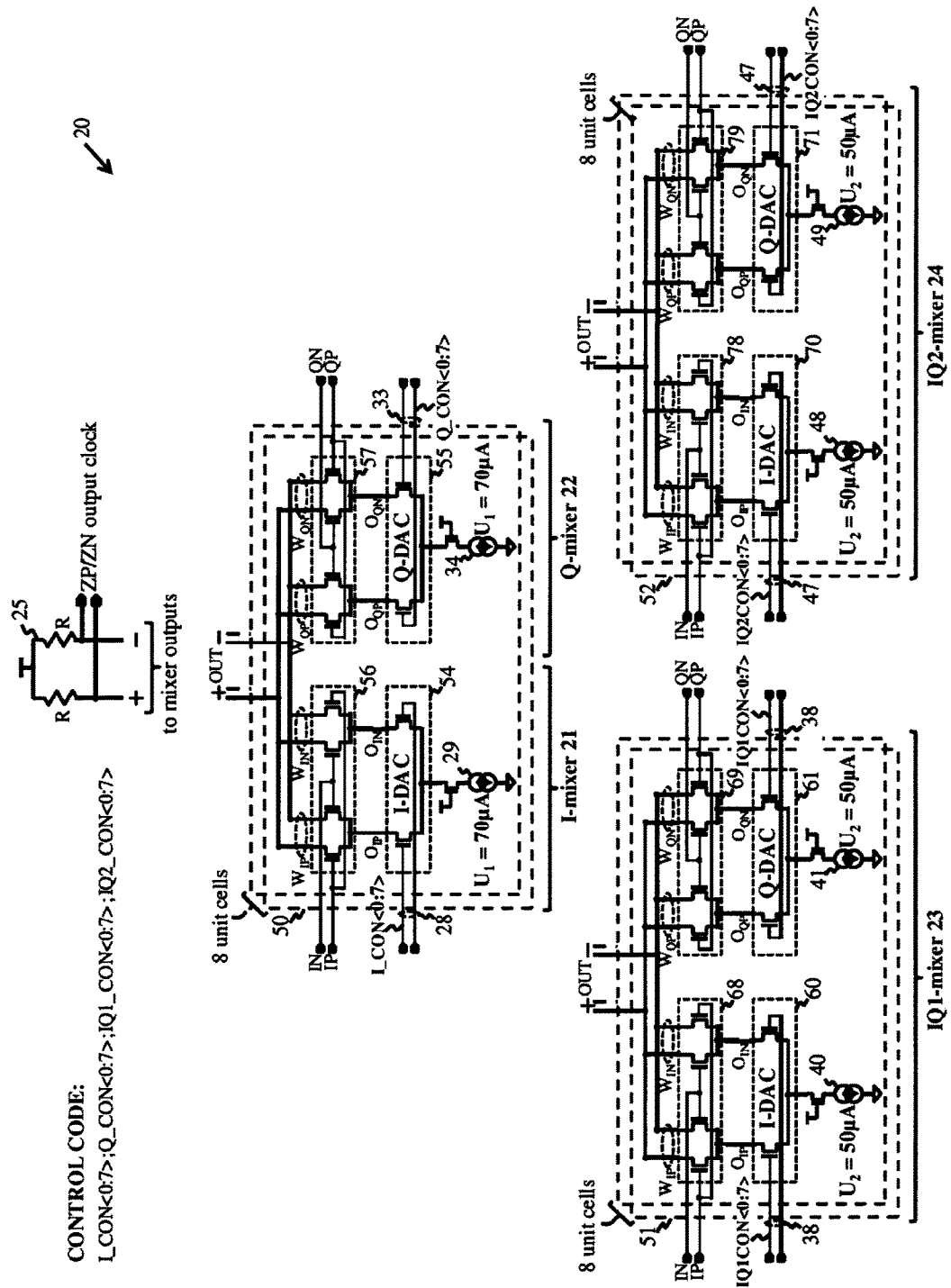
FIG. 3 depicts a detailed implementation of the rotator apparatus of FIG. 2, in accordance with an embodiment of the present invention.

FIG. 3 is a schematic illustration of an exemplary embodiment of OPR 20. Structures corresponding to components of FIG. 2 are indicated by like reference numerals in FIG. 3. In this embodiment, all mixers 21 through 24 are implemented by an array of unit cells. The I- and Q-mixers 21 and 22 are implemented by an array of k=8 unit cells each comprising a joint mixer unit 50. The IQ1-mixer 23 is implemented by an array of n=8 cells each comprising an IQ1-mixer unit 51. The IQ2-mixer 24 is similarly implemented by an array of n=8 cells each comprising an IQ2-mixer unit 52.

Each joint mixer unit 50 comprises an I-DAC component 54, a Q-DAC component 55, and a set of amplifiers comprising a first amplifier pair 56 and a second amplifier pair 57. I-DAC component 54 consists of a switch implemented by a differential field-effect transistor (FET) pair, which receives a first current unit $U_1$, here 70 µA, from a current source 29. The I-DAC switch 54 switches the current unit $U_1$ between outputs $O_{IP}$ and $O_{IN}$ in dependence on one of the k=8 I-control bits. In particular, the I-DAC switches 54 in the eight I-mixer units are controlled by respective bits of the 8 I-control bits I_CON<0:7>. The transistors of differential switch pair 54 (and all further differential pairs described below) receive inputs of opposite polarity. Hence, the gate of one transistor (that connected to output $O_{IP}$) of each switch 54 receives the control bit I_CON<i>=0 or 1, i∈{0, 1, ... 7}, while the gate of the other transistor (that connected to output $O_{IN}$) receives the inverse (1 or 0) of this control bit. A current unit $U_1$ is thus steered to output $O_{IP}$ or $O_{IN}$ depending on the control bit value. The amplifier pair 56 receives phases IP and IN, and weights each phase in dependence on current steered to that phase on I-DAC switch outputs $O_{IP}$ and $O_{IN}$ respectively. In this embodiment, amplifier set 56 comprises a pair of differential amplifiers, implemented by FET pairs connected as shown, for weighting the phases IP and IN to produce respective differential weighted output signals. The differential amplifier connected to output $O_{IP}$ of I-DAC switch 54 thus produces a (differential) weighted output signal on output $W_{IP}$. The differential amplifier connected to output $O_{IN}$ of IDAC switch 54 produces a (differential) weighted output signal on output $W_{IN}$. The I-DAC switches 54 and amplifier pairs 56 of all joint mixer units 50 thus collectively implement the I-mixer 21 of FIG. 2. The weighted signals on amplifier outputs $W_{IP}$ and $W_{IN}$ of all joint mixer units 50 collectively provide the weighted I-signal output by the I-mixer.

The Q-mixer 22 is similarly implemented by the Q-DAC components 55 and amplifier pairs 57 of the eight joint mixer units 50. Each Q-DAC component 55 comprises a switch, implemented by a differential FET pair, which receives a current unit $U_1$=70 μA from a current source 34. Q-DAC switch 55 switches the current unit $U_1$ between outputs $O_{QP}$ and $O_{QN}$ in dependence on a respective bit of the k=8 Q-control bits Q_CON<0:7>. The gate of the transistor connected to output $O_{QP}$ of Q-DAC switch 55 receives the control bit Q_CON<j>, j∈{0, 1, ... 7}, while the gate of the other transistor (connected to output $O_{QN}$) receives the inverse of this control bit. Differential amplifier pair 57 receives and weights the phases QP and QN, based on current steered to that phase on Q-DAC switch outputs $O_{QP}$ and $O_{QN}$ respectively, to produce respective differential weighted output signals on outputs $W_{QP}$ and $W_{QN}$. The weighted signals on amplifier outputs $W_{QP}$ and $W_{QN}$ of all joint mixer units 50 collectively provide the weighted Q-signal output by Q-mixer 22.

The structure of the IQ1- and IQ2-mixer units 51 and 52 is equivalent to that of the joint mixer units 50. However, each of the IQ1- and IQ2-mixer units is responsive to a single bit of the n IQ1- or IQ2-control bits of the corresponding mixer. Each IQ1-mixer unit thus comprises an I-DAC component 60 and a Q-DAC component 61 arranged to switch a second current unit $U_2$ (here 50 μA), from a current source 40 and 41 respectively, in dependence on a respective one of the 8 IQ1-control bits IQ1_CON<0:7>. The I- and Q-DAC components 60, 61 each comprise a switch implemented by a differential FET pair. I-DAC switch 60 is connected to control input 38 such that the gate of the transistor connected to output $O_{IP}$ of the I-DAC switch receives the control bit IQ1_CON<p>, p∈{0, 1, ... 7}, while the gate of the other transistor (connected to output $O_{IN}$) receives the inverse of this control bit. Q-DAC switch 61 is connected to control input 38 such that the gate of the transistor connected to output $O_{QN}$ of the Q-DAC switch receives the control bit IQ1_CON<p>, while the gate of the transistor connected to output $O_{QP}$ receives the inverse of this control bit. The I- and Q-DAC switch outputs are connected to differential amplifier pairs 68, 69 which weight the phases IP, IN, and QP, QN respectively in dependence on current steered to each phase by the I- and Q-DAC switches. The weighted signals on amplifier outputs $W_{IP}$, $W_{IN}$, $W_{QP}$, and $W_{QN}$ of all IQ1-mixer units 51 collectively provide the weighted IQ1-signal output by IQ1-mixer 23.

Each IQ2-mixer unit 52 similarly comprises an I-DAC switch 70 and Q-DAC switch 71 for switching a second current unit $U_2$ from a current source 48 and 49 respectively, and amplifier pairs 78 and 79 connected to the I- and Q-DAC switch outputs. Both I-DAC switch 70 and Q-DAC switch 71 switch a current unit $U_2$ in dependence on a one of the 8 IQ2-control bits IQ2_CON<0:7>. I-DAC switch 70 is connected to control input 47 such that the gate of the transistor connected to output $O_{IP}$ receives the control bit IQ2_CON<q>, q∈{0, 1, ... 7}, while the gate of the other transistor (connected to output $O_{IN}$) receives the inverse of this control bit. Q-DAC switch 71 is connected to control input 47 such that the gate of the transistor connected to output $O_{QP}$ receives the control bit IQ2_CON<q>, while the gate of the transistor connected to output $O_{QN}$ receives the inverse of this control bit. Amplifier pairs 78, 79 weight the phases IP, IN, and QP, QN respectively, and the weighted signals on amplifier outputs $W_{IP}$, $W_{IN}$, $W_{QP}$, and $W_{QN}$ of all IQ2-mixer units 52 collectively provide the weighted IQ2-signal output by IQ2-mixer 24.

In the example illustrated, the amplifier outputs $W_{IP}$, $W_{IN}$, $W_{QP}$, and $W_{QN}$ in each unit cell 50, 51, and 52 are combined to provide a differential output for that cell. The summation circuit 25 here comprises a shared load, implemented by two resistors R, connected to the differential outputs of all mixer cells. The circuit 25 thus sums the weighted signals from all mixers to produce a (differential) output signal ZP/ZN (where the components ZP, ZN are of opposite polarity, ie. 180 degrees out of phase).

The phase of the output clock signal ZP/ZN varies with changes in the control code (I_CON<0:7>; Q_CON<0:7>; IQ1_CON<0:7>; IQ2_CON<0:7>) to define an octagonal phase envelope. Successive phase states of OPR 20 are obtained by changing one bit at a time of the control code. Each bit flip in I_CON<0:7> or Q_CON<0:7> switches one unit of current in one of I-DAC switches 54 or Q-DAC switches 55 respectively. Each bit flip in IQ1_CON<0:7> switches one unit of current in each of the I-DAC switch 60 and Q-DAC switch 61 of one IQ1-mixer cell 51. Each bit flip in IQ2_CON<0:7> switches one unit of current in each of the I-DAC switch 70 and Q-DAC switch 71 of one IQ2-mixer cell 52. To move through successive rotator states around the phase envelope, control bits are flipped sequentially for each mixer, and the different mixers are operated in a defined order. I-mixer 21 contains eight I-DAC switches 54, providing nine different switch configurations (I-mixer states) with successive bit-flips from all-zero I-control bits I_CON<0:7> to all-one I-control bits. The eight Q-DAC switches 55 in Q-mixer 22 similarly give nine different switch configurations (Q-mixer states) with successive bit-flips in Q_CON<0:7> from all-zeros to all-ones. The IQ1- and IQ2 mixers 23 and 24 also have nine states, each with successive bit-flips in IQ1_CON<0:7> and IQ2_CON<0:7> respectively. This provides switch operation based on segmented thermometer coding, giving a 64-state OPR whose phase states define the octagonal phase envelope illustrated schematically in FIG. 4.

Figure 4:
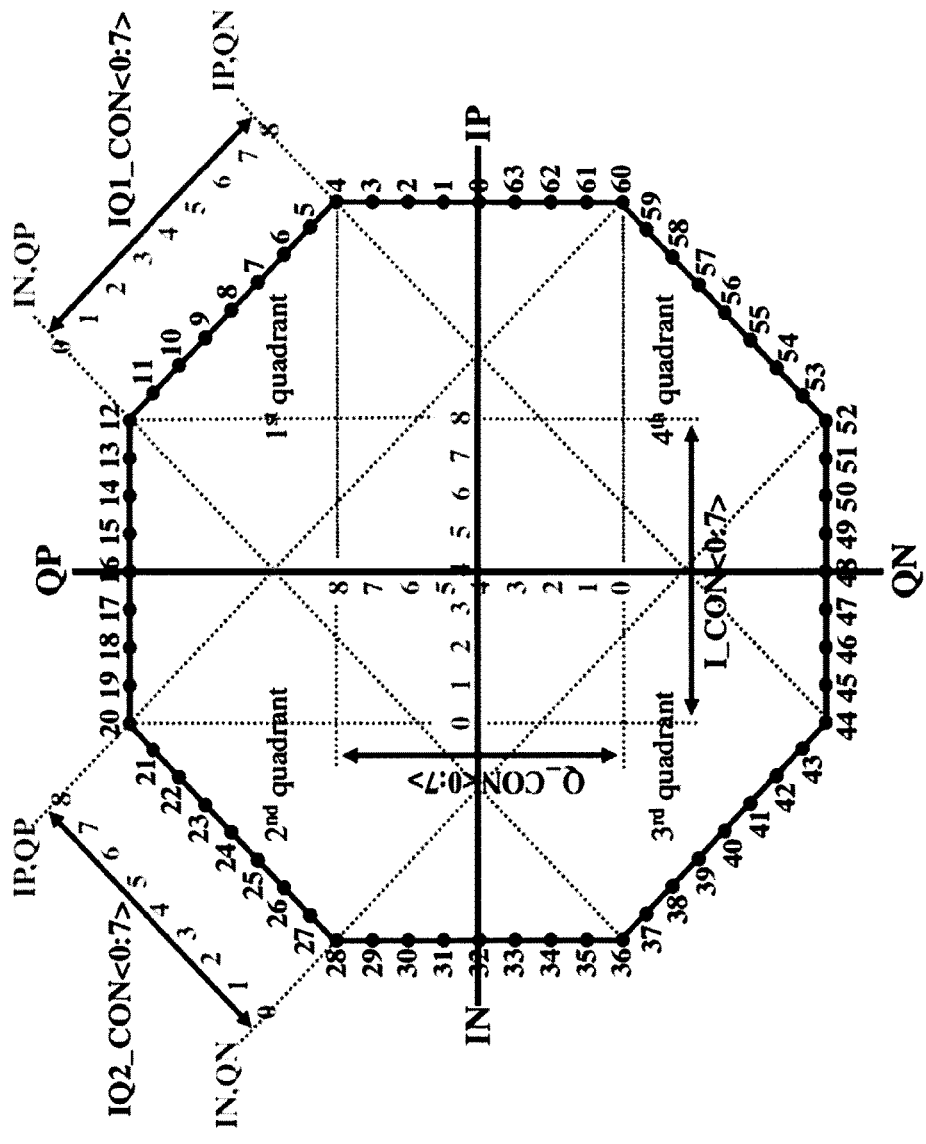
FIG. 4 depicts an octagonal phase envelope produced by the rotator apparatus of FIG. 3, in accordance with an embodiment of the present invention.

The I/Q phase diagram of FIG. 4 indicates how current is steered between the four reference clock phases IP, IN, QP, and QN due to the different switch configurations produced by the control code. The 64 rotator states are labelled 0 to 63 around the four quadrants of the octagonal phase envelope. The state and quadrant numbering shown is an example only and may be otherwise defined according to any desired convention. Successive rotator states are obtained by changing one bit of the control code. The nine different I-mixer states obtained from I_CON<0:7> are labelled 0 to 8 along the I-axis. Successive bit-flips in I_CON<0:7> switch one current unit $U_1$ between IN and IP. In I-DAC state 0, all eight current units $U_1$ are steered to IN. In state 1, seven units $U_1$ are steered to IN and one unit $U_1$ is steered to IP, giving a resultant $6U_1$ to IN. In state 2, six units $U_1$ are steered to IN and two units $U_1$ are steered to IP, giving a resultant $4U_1$ to IN, and so on up to state 8 in which all eight units $U_1$ are steered to IP.

Similarly, the nine different Q-mixer states obtained from Q_CON<0:7> are labelled 0 to 8 along the Q-axis. Successive bit-flips in Q_CON<0:7> switch one current unit $U_1$ between QN and QP. In Q-mixer state 0, all eight current units $U_1$ are steered to QN, with successive bit-flips changing the net current by $2U_1$ up to state 8 in which all eight units $U_1$ are steered to QP.

The IQ1-mixer operates in the $1^{st}$ and $3^{rd}$ quadrants of the phase diagram when the I-mixer is either in state 0 or state 8 and the Q-mixer is either in state 0 or state 8. The nine different IQ1-mixer states obtained from IQ1_CON<0:7> are labelled 0 to 8 in FIG. 4. Successive bit-flips in IQ1_CON<0:7> switch one current unit $U_2$ between IP and IN, and one current unit $U_2$ between QN and QP. In IQ1-mixer state 0, all eight current units $U_2$ are steered to IN by I-DAC switches 60, and all eight current units $U_2$ are steered to QP by Q-DAC switches 61. In IQ1-mixer state 1: $7U_2$ are steered to IN and $1U_2$ to IP by I-DAC switches 60, giving a net $6U_2$ to IN; and $7U_2$ are steered to QP and $1U_2$ to QN by Q-DAC switches 61, giving a net $6U_2$ to QP. This switching continues up to IQ1-mixer state 8 in which all $8U_2$ are steered to IP by I-DAC switches 60, and all $8U_2$ are steered to QN by Q-DAC switches 61. The 8 IQ1-control bits IQ1_CON<0:7> thus control switching of current units between IP,QN and IN,QP by the I- and Q-DACs of the IQ1-mixer.

The IQ2-mixer operates in the $2^{nd}$ and $4^{th}$ quadrants of the phase diagram when the I-mixer is either in state 0 or state 8 and the Q-mixer is either in state 0 or state 8. The nine different IQ2-mixer states obtained from IQ2_CON<0:7> are labelled 0 to 8 in FIG. 4. Successive bit-flips in IQ2_CON<0:7> switch one current unit $U_2$ between IP and IN, and one current unit $U_2$ between QP and QN. In IQ2-mixer state 0, all eight current units $U_2$ are steered to IN by I-DAC switches 70, and all eight current units $U_2$ are steered to QN by Q-DAC switches 71. In IQ2-mixer state 1: $7U_2$ are steered to IN and $1U_2$ to IP by I-DAC switches 70, giving a net $6U_2$ to IN; and $7U_2$ are steered to QN and $1U_2$ to QP by Q-DAC switches 71, giving a net $6U_2$ to QN. This switching continues up to IQ2-mixer state 8 in which all $8U_2$ are steered to IP by I-DAC switches 70, and all $8U_2$ are steered to QP by Q-DAC switches 71. The 8 IQ2-control bits IQ2_CON<0:7> thus control switching of current units between IP,QP and IN,QN by the I- and Q-DACs of the IQ2-mixer.

Figure 5:
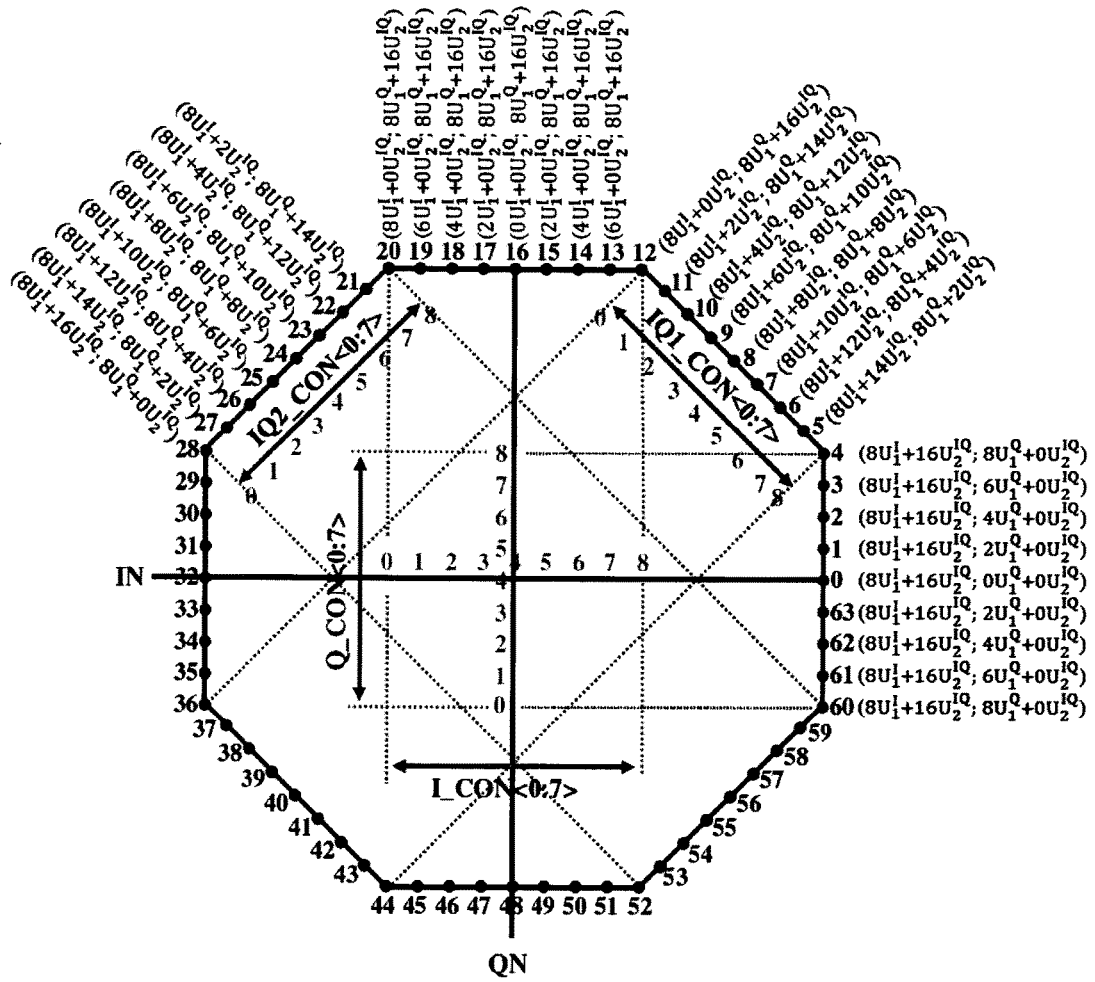
FIG. 5 indicates how current units are steered by DACs of the rotator apparatus of FIG. 3, in accordance with an embodiment of the present invention.

The currents steered to each phase by the mixers 21 through 24 in each rotator state contribute cumulatively to weighting of the input clock phases to produce the output clock signal for that state. The resulting current-steering operation of OPR 20 can be understood from FIG. 5. This indicates the net current contributions of the mixers to the I and Q signal phases in each quadrant for rotator states around the phase envelope. Current units steered by I-mixer 21 to phases of the I signal are denoted by $U_1^I$. Current units steered by Q-mixer 22 to phases of the Q signal are denoted by $U_1^Q$. Current units steered by the IQ1- and IQ2-mixers 23 and 24 to phases of each signal are denoted collectively by $U_2^{IQ}$.

In rotator state 60 (in the fourth quadrant IP-QN), the I-mixer is in state 8, with all $8U_1^I$ steered to IP. The IQ1-mixer is in state 8 with $8U_2$ steered to IP and $8U_2$ steered to QN. The IQ2-mixer is in state 8 with $8U_2$ steered to IP and $8U_2$ steered to QP. This gives a net $16U_2^{IQ}$ to IP with $0U_2^{IQ}$ steered to QN. The Q-mixer is in state 0 with $8U_1^Q$ steered to QN. The resulting current steered to phases IP and QN, denoted (IP; QN), is made up as $(8U_1^I+16U_2^{IQ}; 8U_1^Q+0U_2^{IQ})$ as indicated. In rotator state 61, the I-mixer, IQ1-mixer and IQ2-mixer currents remain unchanged, but the Q-mixer switches to state 1 with $6U_1^Q$ (allocated 7-1 between QN-QP) steered to QN. The resulting current steered to (IP; QN) is made up as $(8U_1^1+16U_2^{IQ}; 6U_1^Q+0U_2^{IQ})$. The Q-mixer changes to its successive states 2, 3, and 4 for rotator states 62, 63, and 0 respectively, giving the current contributions indicated. In rotator state 1 (now in the first quadrant IP-QP), the Q-mixer changes to state 5, with $2U_1^Q$ (allocated 3-5 between QN-QP) steered to QP. The resulting current steered to (IP; QP) is then made up as $(8U_1^I+16U_2^{IQ}; 2U_1^Q+0U_2^{IQ})$. The Q-mixer continues switching current to QP up to Q-mixer state 8 in rotator state 4, giving the current contributions indicated.

For the subsequent rotator states up to state 12, the I-mixer, Q-mixer and IQ2-mixer currents remain unchanged, and the IQ1-mixer takes over, switching down through its successive states 8 to 0. In rotator state 5, the IQ1-mixer switches to state 7 with $6U_2$ (allocated 7-1 between IP-IN) steered to IP, and $6U_2$ (allocated 7-1 between QN-QP) steered to QN. The IQ2-mixer is still in state 8, with $8U_2$ steered to IP and $8U_2$ steered to QP. This gives a net $14U_2^{IQ}$ to IP and a net $2U_2^{IQ}$ steered to QP. In rotator state 6, the IQ1-mixer switches to state 6 with $4U_2$ (allocated 6-2 between IP-IN) steered to IP, and $4U_2$ (allocated 6-2 between QN-QP) steered to QN. The IQ2-mixer is still in state 8, with $8U_2$ steered to IP and $8U_2$ steered to QP. This gives a net $12U_2^{IQ}$ to IP and a net $4U_2^{IQ}$ steered to QP. The IQ1-mixer continues switching down through its successive states up to rotator state 12, giving the net current contributions indicated.

For the following rotator states up to state 20, the Q-mixer, IQ1-mixer and IQ2-mixer currents remain unchanged, and the I-mixer takes over, switching down through its successive states 8 to 0. With each step here, $1U_1^I$ is switched from IP to IN, giving the net current contributions indicated.

For rotator states 21 to 28, the I-mixer, Q-mixer, and IQ1-mixer currents remain unchanged, and the IQ2-mixer takes over, switching down through its successive states 8 to 0. In rotator state 21, the IQ2-mixer switches to state 7 with $6U_2$ (allocated 7-1 between IP-IN) steered to IP, and $6U_2$ (allocated 7-1 between QP-QN) steered to QP. The IQ1-mixer is still in state 0, with $8U_2$ steered to IN and $8U_2$ steered to QP. This gives a net $2U_2^{IQ}$ to IN and $14U_2^{IQ}$ steered to QP. The IQ1-mixer continues switching down through its successive states up to rotator state 28, giving the net current contributions indicated. For the remaining rotator states, the mixers switch in sequence back through their respective states, and the current contributions can be deduced accordingly.

The above apparatus provides an octagonal phase rotator with exceptional performance. An octagonal constellation is achieved without polarity switches, eliminating glitches due to polarity switching and reducing systematic jitter. The OPR also offers lower voltage operation and enhanced operating speeds. The apparatus requires fewer stacked transistors than prior octagonal rotators since no voltage headroom is required for polarity switches. Parasitic effects are also reduced allowing higher speed operation.

Each rotator step requires switching of only one or two transistor pairs. Moreover, the apparatus provides a highly-efficient circuit arrangement. The unit cells implementing all mixers have the same simple circuit structure, whereby the rotator array requires only a single cell structure providing a homogenous layout.

It will of course be appreciated that many changes and modifications can be made to the embodiments described above. For example, while n=k=8 is optimal for the above design, other values may be used in other designs, e.g. n=k>8 for enhanced resolution. The values of n and k may also be different in some embodiments. Other embodiments may of course use different values for current units $U_1$ and $U_2$.

Other transistor arrangements for implementing the various switches and amplifiers can be envisaged, and the amplifier sets in the I-, Q- and IQ-mixers could be implemented in various ways. For example, while differential signaling using the differential amplifier configuration described is preferred to reduce effects of noise, single-ended signaling may be employed if desired to reduce power consumption. A single amplifier may then be used in place of each differential pair described above.

While an N-channel Metal-Oxide-Semiconductor (NMOS) circuit configuration is described for FIG. 3 above, P-channel Metal-Oxide-Semiconductor (PMOS) implementations may also be used.

While OPR operation is described above with reference to clock signals in an I/O link transceiver circuit, OPRs embodying the invention may be employed in any application which requires conversion from a digital to an analog phase domain.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An octagonal phase rotator (OPR) apparatus for producing an output signal that is phase dependent on a digital control code, the OPR apparatus comprising:
    an I-mixer, responsive to one or more I-control bits of the digital control code, comprising an I-Digital-to-Analog Converter (DAC) for steering current between a positive phase IP and a negative phase IN of an in-phase (I) signal wherein the one or more I-control bits control switching of a first current unit between IP and IN, and a set of amplifiers for weighting the positive phase IP and the negative phase IN, in dependence on the current steered to each phase by the I-DAC, to produce a weighted I-signal;
    a Q-mixer, responsive to one or more Q-control bits of the digital control code, comprising a Q-DAC for steering the current between a positive phase QP and a negative phase QN of a quadrature (Q) signal wherein the one or more Q-control bits control switching of the first current unit between QP and QN, and a second set of amplifiers for weighting the positive phase QP and the negative phase QN, in dependence on the current steered to each phase by the Q-DAC, to produce a weighted Q-signal;
    an IQ1-mixer and an IQ2-mixer responsive to one or more IQ1-control bits and one or more IQ2-control bits, respectively, of the digital control code, the IQ1-mixer and the IQ2-mixer each comprising a second I-DAC for steering the current between IP and IN, a second Q-DAC for steering the current between QP and QN, and a third set of amplifiers for weighting the positive phase IP, the negative phase IN, the positive phase QP, and the negative phase QN, in dependence on the current steered to each phase by the second I-DAC and the second Q-DAC, to produce a weighted IQ-signal; and
    a summation circuit arranged to sum the weighted I-signal, the weighted Q-signal, and the weighted IQ-signal to produce the output signal,
        wherein the one or more IQ1-control bits of the IQ1-mixer and the one or more IQ2-control bits of the IQ2-mixer control switching of a second current unit in each of the second I-DAC and the second Q-DAC, of the IQ1-mixer and the IQ2-mixer, respectively, such that current units are switched between IP,QN and IN,QP by the second I-DAC and the second Q-DAC of the IQ1-mixer and between IP,QP and IN,QN by the second I-DAC and the second Q-DAC of the IQ2-mixer.

2. The OPR apparatus of claim 1, wherein:
    the IQ1-mixer and the IQ2-mixer each comprise one or more IQ-mixer units, wherein the one or more IQ-mixer units are responsive to a respective bit of the control bits of a respective IQ-mixer and both the IQ1-mixer and the IQ2-mixer each comprise the second I-DAC and the second Q-DAC arranged to switch the second current unit in dependence on the respective bit, and the third set of amplifiers for weighting the phases IP, IN, QP, and QN in dependence on the current steered to each phase by the second I-DAC and the second Q-DAC; and
    the I-mixer and the Q-mixer are provided by one or more joint mixer units each comprising the I-DAC and the Q-DAC, the I-DAC being arranged to switch the first current unit between IP and IN in dependence on a second respective bit of the one or more I-control bits and the Q-DAC being arranged to switch the first current unit between QP and QN in dependence on a respective bit of the one or more Q-control bits, a first set of amplifiers, and a second set of amplifiers for weighting the phases IP, IN, QP, and QN in dependence on the current steered to each phase by the I-DAC and the Q-DAC.

3. The OPR apparatus of claim 1, further comprising a control code generator connected to the I-mixer, the Q-mixer, the IQ1-mixer, and the IQ2-mixer for supplying the one or more I-control bits, the one or more Q-control bits, the one or more IQ1-control bits, and the one or more IQ2-control bits, respectively.

4. The OPR apparatus of claim 2, wherein the third set of amplifiers in the one or more IQ-mixer units and the second set of amplifiers in the one or more joint mixer units comprise a first pair of differential amplifiers for weighting the positive phase IP and the negative phase IN respectively, and a second pair of differential amplifiers for weighting the positive phase QP and the negative phase QN respectively.

5. The OPR apparatus of claim 4, further comprising a control code generator connected to the I-mixer, the Q-mixer, the IQ1-mixer, and the IQ2-mixer for supplying the one or more I-control bits, the one or more Q-control bits, the one or more IQ1-control bits, and the one or more IQ2-control bits, respectively.

6. The OPR apparatus of claim 1, wherein:
the I-mixer is responsive to a plurality (k) of I-control bits of the digital control code;
the Q-mixer is responsive to k Q-control bits of the digital control code;
the IQ1-mixer is responsive to a plurality (n) of IQ1-control bits of the digital control code; and
the IQ2-mixer is responsive to n IQ-2 control bits of the digital control code.

7. The OPR apparatus of claim 6, wherein k is equal to n.

8. The OPR apparatus of claim 7, wherein k is equal to n is equal to 8.

9. A link transceiver apparatus comprising:
a transmitter circuit for transmitting data over a link; and
a receiver circuit for receiving data from the link, wherein the transmitter circuit and the receiver circuit comprise an octagonal phase rotator (OPR) apparatus for producing an output clock signal that is phase dependent on a digital control code, wherein the OPR apparatus comprises:
an I-mixer, responsive to one or more I-control bits of the digital control code, comprising an I-Digital-to-Analog Converter (DAC) for steering current between a positive phase IP and a negative phase IN of an in-phase (I) signal wherein the one or more I-control bits control switching of a first current unit between IP and IN, and a set of amplifiers for weighting the positive phase IP and the negative phase IN, in dependence on the current steered to each phase by the I-DAC, to produce a weighted I-signal;
a Q-mixer, responsive to one or more Q-control bits of the digital control code, comprising a Q-DAC for steering the current between a positive phase QP and a negative phase QN of a quadrature (Q) signal wherein the one or more Q-control bits control switching of the first current unit between QP and QN, and a second set of amplifiers for weighting the positive phase QP and the negative phase QN, in dependence on the current steered to each phase by the Q-DAC, to produce a weighted Q-signal;
an IQ1-mixer and an IQ2-mixer responsive to one or more IQ1-control bits and one or more IQ2-control bits, respectively, of the digital control code, the IQ1-mixer and the IQ2-mixer each comprising a second I-DAC for steering the current between IP and IN, a second Q-DAC for steering the current between QP and QN, and a third set of amplifiers for weighting the positive phase IP, the negative phase IN, the positive phase QP, and the negative phase QN, in dependence on the current steered to each phase by the second I-DAC and the second Q-DAC, to produce a weighted IQ-signal; and
a summation circuit arranged to sum the weighted I-signal, the weighted Q-signal, and the weighted IQ-signal to produce the output signal,
wherein the one or more IQ1-control bits of the IQ1-mixer and the one or more IQ2-control bits of the IQ2-mixer control switching of a second current unit in each of the second I-DAC and the second Q-DAC, of the IQ1-mixer and the IQ2-mixer, respectively, such that current units are switched between IP,QN and IN,QP by the second I-DAC and the second Q-DAC of the IQ1-mixer and between IP,QP and IN,QN by the second I-DAC and the second Q-DAC of the IQ2-mixer.

10. The link transceiver apparatus of claim 9, wherein:
the IQ1-mixer and the IQ2-mixer each comprise one or more IQ-mixer units, wherein the one or more IQ-mixer units are responsive to a respective bit of the control bits of a respective IQ-mixer and both the IQ1-mixer and the IQ2-mixer each comprise the second I-DAC and the second Q-DAC arranged to switch the second current unit in dependence on the respective bit, and the third set of amplifiers for weighting the phases IP, IN, QP, and QN in dependence on the current steered to each phase by the second I-DAC and the second Q-DAC; and
the I-mixer and the Q-mixer are provided by one or more joint mixer units each comprising the I-DAC and the Q-DAC, the I-DAC being arranged to switch the first current unit between IP and IN in dependence on a second respective bit of the one or more I-control bits and the Q-DAC being arranged to switch the first current unit between QP and QN in dependence on a respective bit of the one or more Q-control bits, a first set of amplifiers, and a second set of amplifiers for weighting the phases IP, IN, QP, and QN in dependence on the current steered to each phase by the I-DAC and the Q-DAC.

11. The link transceiver apparatus of claim 10, wherein the third set of amplifiers in the one or more IQ-mixer units and the second set of amplifiers in the one or more joint mixer units comprise a first pair of differential amplifiers for weighting the positive phase IP and the negative phase IN respectively, and a second pair of differential amplifiers for weighting the positive phase QP and the negative phase QN respectively.

12. An octagonal phase rotator (OPR) apparatus for producing an output signal that is phase dependent on a digital control code, the OPR apparatus comprising:
an I-mixer, responsive to one or more I-control bits of the digital control code;
a Q-mixer, responsive to one or more Q-control bits of the digital control code;
an IQ1-mixer and an IQ2-mixer responsive to one or more IQ1-control bits and one or more IQ2-control bits, respectively, of the digital control code; and
a summation circuit arranged to sum the weighted I-signal, the weighted Q-signal, and the weighted IQ-signal to produce the output signal.

13. The OPR apparatus of claim 12, wherein the I-mixer comprises:
an I-Digital-to-Analog Converter (DAC) for steering current between a positive phase IP and a negative phase IN of an in-phase (I) signal wherein the one or more I-control bits control switching of a first current unit between IP and IN, and a set of amplifiers for weighting the positive phase IP and the negative phase IN, in dependence on the current steered to each phase by the I-DAC, to produce a weighted I-signal.

14. The OPR apparatus of claim 12, wherein the Q-mixer comprises:

a Q-DAC for steering the current between a positive phase QP and a negative phase QN of a quadrature (Q) signal wherein the one or more Q-control bits control switching of the first current unit between QP and QN, and a second set of amplifiers for weighting the positive phase QP and the negative phase QN, in dependence on the current steered to each phase by the Q-DAC, to produce a weighted Q-signal.

15. The OPR apparatus of claim 12, wherein the IQ1-mixer and the IQ2-mixer each comprise:
a second I-DAC for steering the current between IP and IN, a second Q-DAC for steering the current between QP and QN, and a third set of amplifiers for weighting the positive phase IP, the negative phase IN, the positive phase QP, and the negative phase QN, in dependence on the current steered to each phase by the second I-DAC and the second Q-DAC, to produce a weighted IQ-signal.

16. The OPR apparatus of claim 12, wherein at least one of the IQ1-mixer and the IQ2-mixer comprises:
a second I-DAC for steering the current between IP and IN, a second Q-DAC for steering the current between QP and QN, and a third set of amplifiers for weighting the positive phase IP, the negative phase IN, the positive phase QP, and the negative phase QN, in dependence on the current steered to each phase by the second I-DAC and the second Q-DAC, to produce a weighted IQ-signal.

17. The OPR apparatus of claim 12, wherein the one or more IQ1-control bits of the IQ1-mixer and the one or more IQ2-control bits of the IQ2-mixer control switching of a second current unit in each of the second I-DAC and the second Q-DAC, of the IQ1-mixer and the IQ2-mixer, respectively, such that current units are switched between IP,QN and IN,QP by the second I-DAC and the second Q-DAC of the IQ1-mixer and between IP,QP and IN,QN by the second I-DAC and the second Q-DAC of the IQ2-mixer.

\* \* \* \* \*